United States Patent
Beukema et al.

(10) Patent No.: US 10,826,536 B1
(45) Date of Patent: Nov. 3, 2020

(54) INTER-CHIP DATA TRANSMISSION SYSTEM USING SINGLE-ENDED TRANSCEIVERS

(71) Applicant: International Business Machines Corporation, Armonk, NY (US)

(72) Inventors: Troy James Beukema, Briarcliff Manor, NY (US); Mounir Meghelli, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/592,747

(22) Filed: Oct. 3, 2019

(51) Int. Cl.
*H03M 13/19* (2006.01)
*H04L 25/49* (2006.01)

(52) U.S. Cl.
CPC ........ *H03M 13/19* (2013.01); *H04L 25/4908* (2013.01)

(58) Field of Classification Search
CPC ........ H03M 13/19; H03M 5/145; H03M 7/46; H04L 25/14; H04L 25/4908
USPC ............... 341/58, 59, 63; 714/706, 763, 777
See application file for complete search history.

(56) References Cited

U.S. PATENT DOCUMENTS

| | | | | | |
|---|---|---|---|---|---|
| 6,002,275 | A * | 12/1999 | Hosokawa | ............... | G11C 8/10 327/51 |
| 6,069,891 | A * | 5/2000 | Mandalia | ............. | H04L 12/6418 370/352 |
| 6,078,580 | A * | 6/2000 | Mandalia | ............... | H04M 3/51 370/352 |
| 6,218,968 | B1 * | 4/2001 | Smeets | ................. | H03M 7/40 341/65 |
| 6,288,655 | B1 * | 9/2001 | Tsang | ..................... | H03M 7/20 341/59 |
| 7,149,955 | B1 * | 12/2006 | Sutardja | ............... | H03M 13/19 714/809 |
| 7,440,316 | B1 | 10/2008 | Lee et al. | | |
| 7,490,189 | B2 | 2/2009 | Eberle et al. | | |
| 7,802,151 | B1 * | 9/2010 | Sutardja | ............... | H03M 13/19 714/701 |
| 7,809,054 | B2 * | 10/2010 | Carballo | .......... | H04L 25/03063 375/229 |
| 7,961,990 | B2 | 6/2011 | Krishnamoorthy et al. | | |

(Continued)

FOREIGN PATENT DOCUMENTS

GB 2523586 A 2/2015

OTHER PUBLICATIONS

Congzhe Cao, Minimal Sets for Capacity-Approaching Variable-Length Constrained Sequence Codes, IEEE Transactions on Communications—Oct. 2018, 14 pages.

(Continued)

*Primary Examiner* — Lam T Mai
(74) *Attorney, Agent, or Firm* — Daniel Morris; Otterstedt, Wallace & Kammer, LLP

(57) ABSTRACT

A single-ended inter-chip data transmission system and a single-ended inter-chip data reception system are provided for processing data. A controlled Hamming weight parallel data encoder at a transmitter device accepts N data bits with an arbitrary Hamming weight as input and generates M data bits with a controlled Hamming weight as output, wherein M is greater than N. A transmission circuit provides a time-aligned transmission of the controlled Hamming weight encoded data across a single-ended data bus.

20 Claims, 11 Drawing Sheets

(56) References Cited

U.S. PATENT DOCUMENTS

| | | | | |
|---|---|---|---|---|
| 8,020,069 | B1* | 9/2011 | Feng | G11B 20/1866 714/758 |
| 8,223,042 | B2* | 7/2012 | Abbasfar | H03M 5/145 341/58 |
| 8,539,318 | B2 | 9/2013 | Cronie et al. | |
| 8,649,460 | B2 | 2/2014 | Ware et al. | |
| 9,100,232 | B1 | 8/2015 | Hormati et al. | |
| 9,575,270 | B2 | 2/2017 | Sharapov et al. | |
| 2008/0260049 | A1 | 10/2008 | Wood | |
| 2010/0097159 | A1* | 4/2010 | Hankui | H01L 25/0657 333/103 |
| 2010/0232602 | A1* | 9/2010 | Nobukata | H04L 9/0618 380/28 |
| 2011/0025533 | A1* | 2/2011 | Abbasfar | H04L 25/4908 341/63 |
| 2011/0075740 | A1* | 3/2011 | Ferraiolo | H04L 25/0272 375/257 |
| 2013/0010892 | A1 | 1/2013 | Cronie et al. | |
| 2014/0298458 | A1* | 10/2014 | Lewis | H04L 9/003 726/22 |
| 2014/0298459 | A1* | 10/2014 | Lewis | G06F 21/755 726/22 |
| 2015/0026527 | A1* | 1/2015 | Hou | H04L 1/24 714/706 |
| 2016/0154049 | A1* | 6/2016 | Oshiyama | H01L 22/32 324/762.01 |
| 2016/0352359 | A1* | 12/2016 | Ordentlich | H03M 13/155 |
| 2017/0171869 | A1* | 6/2017 | Sun | H04L 5/0053 |
| 2018/0091351 | A1 | 3/2018 | Holden et al. | |

OTHER PUBLICATIONS

Ai-Bassam, An Abstract of the Thesis entitled Balanced Codes, Jan. 4, 1990, 135 pages.

Poulton et al., A 1.17-pJ/b, 25-Gb/s/pin Ground-Referenced Single-Ended Serial Link for Off- and On-Package communication Using a Process- and Temperature-Adaptive Voltage Regulator, IEEE Journal of Solid-State Circuits, vol. 54, No. 1, Jan. 2019, pp. 43-54.

Shokrollahi et al., 10.1 A pin-efficient 20.83 Gb/s/wire 0.94 pJ/bit forwarded clock CNRZ-5-coded SerDes up to 12mm for MCM packages in 28nm CMOS, 2016 IEEE International Solid-State Circuits Conference (ISSCC), pp. 182-183, IEEE, 2016.

* cited by examiner

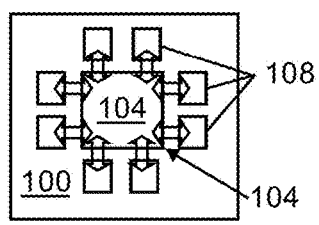
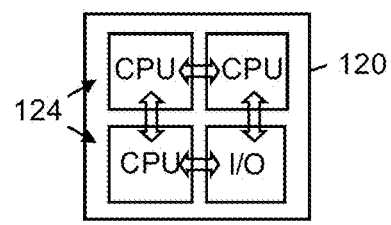
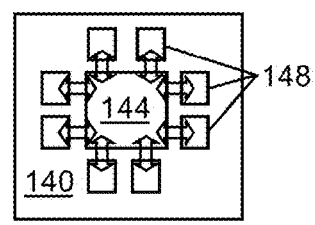
FIG. 1A            FIG. 1B            FIG. 1C
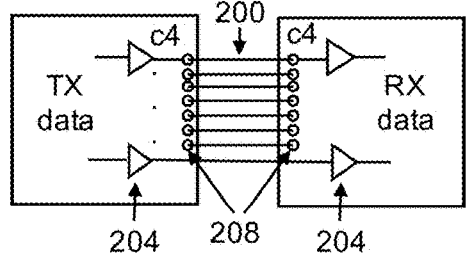
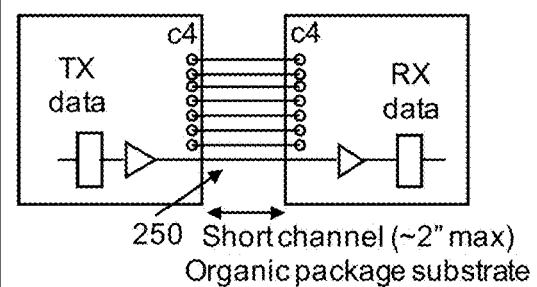
FIG. 2A            FIG. 2B
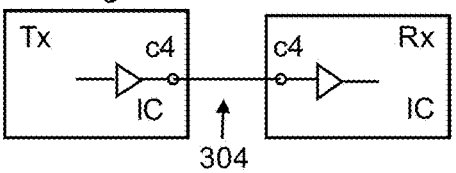
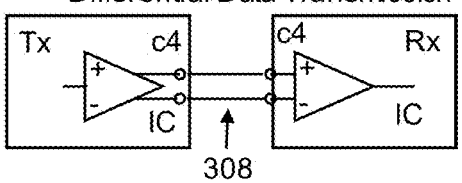
FIG. 3A            FIG. 3B

8/11 code

| data | bus codeword |
|---|---|
| 00000000 | 00011111000 |
| 00000001 | 00011110001 |
| 00000010 | 00011101001 |
| 00000011 | 00011100010 |
| 00000100 | 00011011001 |
| 00000101 | 00011010010 |
| 00000110 | 00011001010 |
| 00000111 | 00000111011 |
| 00001000 | 00000111001 |
| 00001001 | 00110110010 |
| 00001010 | 00110101010 |
| .. | .. |
| 11111111 | 11110000000 |

16/20 code

| data | bus codeword |
|---|---|
| 0000000000000000 | 00000000011111111101 |
| 0000000000000001 | 00000001111111101000 |
| 0000000000000010 | 00000001111111011000 |
| 0000000000000011 | 00000001111111001001 |
| 0000000000000100 | 00000001111110111000 |
| 0000000000000101 | 00000001111110101001 |
| 0000000000000110 | 00000001111110011001 |
| 0000000000000111 | 00000001111110001110 |
| 0000000000001000 | 00000001111101111000 |
| 0000000000001001 | 00000001111101101001 |
| 0000000000001010 | 00000001111101011001 |
| .. | .. |
| 1111111111111111 | 11111111000000000100 |

*FIG. 5*

| Data | Codeword | Permuted |
|---|---|---|
| 000000000000 | 000000001111111101 | 001010100101101011 |
| 000000000001 | 000000011111101000 | 011010101101011010 |
| 000000000010 | 000000011111101000 | 011010101101010010 |
| 000000000011 | 000000011111101001 | 011010101101010011 |
| 000000000100 | 000000011111011000 | 011000101101011010 |
| 000000000101 | 000000011111010101 | 011000101101011011 |
| 000000000110 | 000000011111110001 | 011000111001101010 |
| 000000000111 | 000000011111001110 | 011000111001101011010 |
| 000000001000 | 000000011111111000 | 011010101100001010 |
| 000000001001 | 000000011111101001 | 011010101000101011 |
| 000000001010 | 000000011111011001 | 011010101000101011 |
| ... | ... | ... |
| 111111111111 | 111111110000000100 | 110101001010101010100 |

*FIG. 6*

INTER-CHIP DATA TRANSMISSION SYSTEM USING SINGLE-ENDED TRANSCEIVERS

BACKGROUND

The present invention relates to the design of integrated circuits (ICs), and more specifically, to inter-chip data transmission systems.

Modern high performance computing and information systems are increasingly migrating toward the use of multi-chip modules (MCM) to scale up processing capability while minimizing power, area, and total system cost. This strategy is enabled by exponential advances in complementary metal-oxide semiconductor (CMOS) integrated circuit (IC) technology, which today permits integration of high performance computer integrated circuits together with memory and/or input/output (I/O) devices on a single, high-wiring-density MCM package, while maintaining thermal design power at design targets to permit reliable system operation. By avoiding the need to escape a package and interconnect disparate ICs via a printed-circuit board (PCB), the power and complexity of the input-output circuitry can be reduced while simultaneously increasing interconnect data rates due to short spatial separation and low channel loss on the MCM compared to PCB traces.

SUMMARY

Principles of the invention provide techniques for inter-chip data transmission system using single-ended transceivers. In one aspect, an exemplary single-ended inter-chip data transmission system comprises a controlled Hamming weight parallel data encoder at a transmitter device configured to accept N data bits with an arbitrary Hamming weight as input and generate M data bits with a controlled Hamming weight as output, wherein M is greater than N; and a transmission circuit for a time-aligned transmission of the controlled Hamming weight encoded data across a single-ended data bus.

In one aspect, a single-ended inter-chip data reception system comprises a self-reference generator, the self-reference generator configured to produce a voltage reference signal based on two or more analog signals of a received data bus; and a controlled Hamming weight data decoder configured to accept M data bits with a controlled Hamming weight as input and generate N data bits with an arbitrary Hamming weight as output, wherein M is greater than N.

In one aspect, a method for processing data comprises generating M data bits with a controlled Hamming weight based on N input data bits with an arbitrary Hamming weight, wherein M is greater than N; and generating a time-aligned transmission of the controlled Hamming weight encoded data across a single-ended data bus.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. For example, one or more embodiments may provide one or more of the following advantages:

2-level binary signaling on single-ended lines to minimize system implementation complexity, required number of I/O pins, and power consumption;

a bus-level encoding method which adds extra data lanes to ensure that the data across the bus has a controlled (ideally constant) Hamming weight, independent of the transmitted data, to minimize or circumvent data-dependent ground bounce and receiver reference generation;

constant Hamming weight (constant number of ones across the bus) ensures the average or DC value of all the lines on the data bus maintains a nominal constant value enabling the data bus to be self-referenced via the data lines at the receiver;

simple non-return to zero (NRZ) signaling, permitting power efficient realizations with the potential to achieve 1 pJ/b power efficiency or even lower in modern CMOS technology;

increased data rate (per mm of die edge) by enabling higher data rate (such as 16 Gb/s and higher) single-ended serial data transmission when realized in combination with serializer-deserializer (SERDES) I/O (compared to low data rate (such as 2 Gb/s) parallel bus transmission);

reduced circuit complexity, circuit area, power draw, and data latency (compared to 4-level 100 Gb/s based inter-chip MCM I/O approaches).

removal of the susceptibility of the system to performance degradation from non-symmetric 1 and 0 transmissions about ground level, or varying ground levels from IC to IC due to its inherent floating self-reference capability (compared to ground-reference signaling (GRS) approaches);

similar power efficiency and aggregate data rate/mm of die (compared to technologies such as orthogonal bus encoding (see, e.g. Amin Shokrollahi et al., A Pin-Efficient 20.83 Gb/s/wire 0.94 pJ/bit Forwarded Clock CNRZ-5-Coded SerDes up to 12 mm for MCM Packages in 28 nm CMOS, 2016 IEEE International Solid-State Circuits Conference, ISSCC 2016/Feb. 2, 2016, pages 182-184, Kandou Bus, hereinafter "Kandou") while offering a simple implementation, requiring only 2-level transmit and receive signaling across the bus with bus encoding done in the digital domain with efficient CMOS digital logic as opposed to the required mixed-signal domain decoder required in Kandou's orthogonal bus encoding approaches; and greater pin efficiency (compared to differential serial bus encoding: 20 pins vs. 32 pins required for a 16-bit differential bus).

These and other features and advantages of the present invention will become apparent from the following detailed description of illustrative embodiments thereof, which is to be read in connection with the accompanying drawings.

BRIEF DESCRIPTION OF THE DRAWINGS

FIG. 1A illustrates an MCM with an integrated graphics-processing unit (GPU) and high-bandwidth memory (HBM) to enable high performance computing and video processing;

FIG. 1B illustrates a multiple-CPU and I/O hybrid MCM which enables integration of high core count processors in a single package;

FIG. 1C illustrates an application of a high capacity optical switch chip where an electrical CMOS switch interfaces to electrical-to-optical (EO) and optical-to-electrical (OE) conversion circuits on the package;

FIG. 2A depicts a parallel bus that employs a large number of relatively low data rate I/O interconnects;

FIG. 2B depicts a serial architecture that employs a single high data rate I/O interconnect;

FIG. 3A depicts a single-ended serial interconnect;

FIG. 3B depicts a differential serial interconnect;

FIG. 5 is a listing of the first few codewords for example 8/11 and 16/20 codes, respectively, in accordance with an example embodiment;

FIG. 6 is a listing of the resulting permuted codeword, in accordance with an example embodiment;

DETAILED DESCRIPTION

Figure 4:
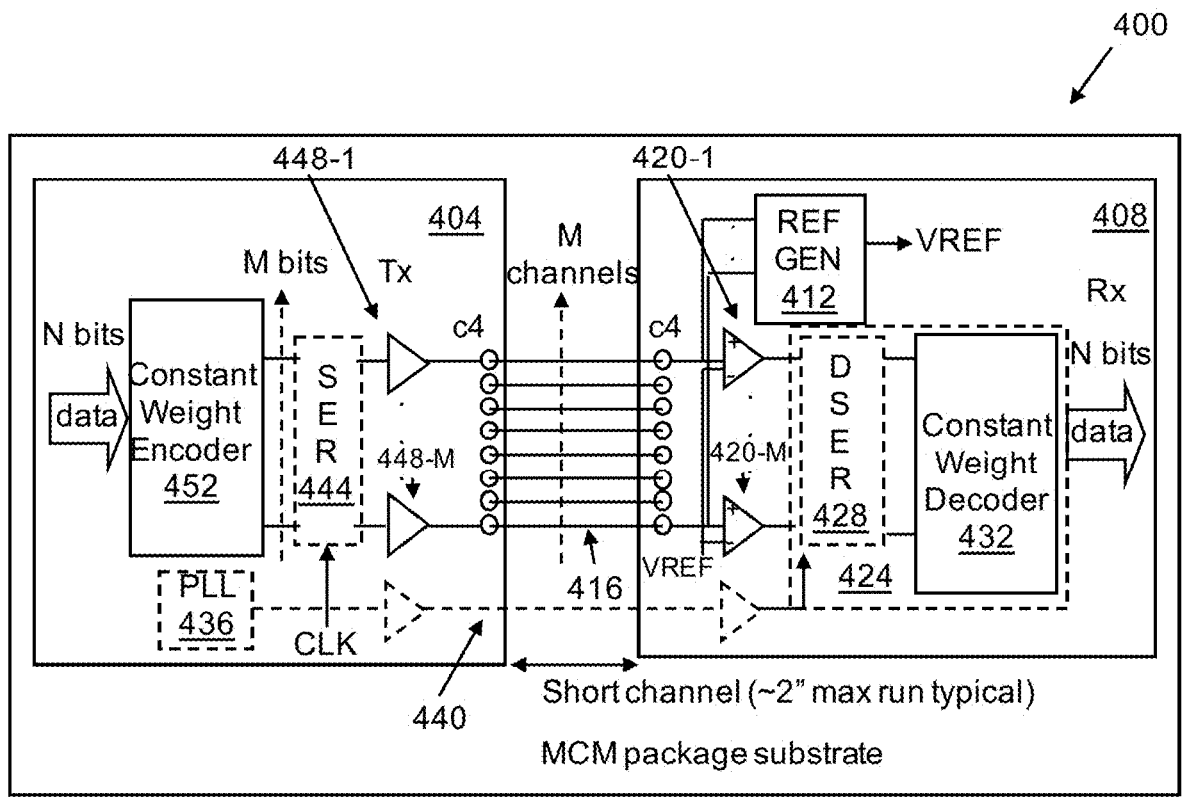
FIG. 4 is a schematic diagram of an inter-chip data transmission system, in accordance with an example embodiment.

Aspects of the invention provide a method and/or apparatus to achieve low power, high escape density chip interconnect for MCM applications. In one or more embodiments, an exemplary system employs 2-level binary signaling on single-ended lines to minimize system implementation complexity, required number of I/O pins, and power consumption. To circumvent well-known problems with high data rate single-ended signaling (including data-dependent ground bounce and receiver reference generation), one or more embodiments employ a bus-level encoding method which adds extra data lanes to ensure that the data across the bus has a controlled (ideally constant) Hamming weight, independent of the transmitted data. The constant Hamming weight (constant number of ones across the data bus) in turn ensures that the average or direct current (DC) value of all the lines on the data bus maintains a nominal constant value, so the data bus can be easily self-referenced via the data lines at the receiver. In one or more embodiments, the circuitry required to encode/decode data to/from a constant Hamming weight representation is realized in the digital domain and can be efficiently realized using modern power and area efficient CMOS logic libraries with low logic latency. Once the data is constant Hamming-weight encoded, it can be transmitted and received on each data lane using simple non-return to zero (NRZ) signaling, permitting power efficient realizations with the potential to achieve 1 picojoule/bit (pJ/b) power efficiency or even lower in modern CMOS technology.

One or more embodiments advantageously provide techniques for inter-chip single-ended data transmission for, for example, application in multi-chip-module (MCM) systems. Example MCM applications are shown in FIGS. 1A-1C. FIG. 1A illustrates an MCM 100 with an integrated graphics-processing unit (GPU) 104 and high-bandwidth memory (HBM) 108 to enable high performance computation and video processing. FIG. 1B illustrates a multiple-CPU and I/O hybrid MCM 120 which enables integration of high core count processors 124 in a single package. FIG. 1C illustrates an application of a high capacity optical switch chip 140 where an electrical CMOS switch 144 interfaces to electrical-to-optical (EO) and optical-to-electrical (OE) conversion circuits 148 on the package. In each of these applications, maximizing the data rate while simultaneously minimizing the power and area of the I/O circuitry used to interconnect the ICs on the MCM is appropriate to meet both thermal-design power and system performance goals.

Many different design techniques can be used to interconnect discrete ICs on an MCM and, at a high level, can be categorized into 1) a parallel bus running at the standard digital CMOS clock frequency; and 2) serial bus architectures (as shown in FIGS. 2A-2B).

FIG. 2A depicts a parallel bus 200 that employs a large number of relatively low data rate I/O interconnects. (Each I/O connection transmits data at, for example, approximately 2-3 gigabit/second (Gb/s) with state-of-the-art technology.) The advantage of the parallel bus 200 is its simplicity of implementation of the I/O circuits 204. The I/O circuits 204 typically require little or no line equalization due to the lower data rates, which enables them to be realized with power efficiency in the 1 pJ/bit range in state-of-the-art systems. The disadvantage of this approach is the requirement of a large number of I/O pins 208 (here diagrammed as controlled collapse chip connection (c4) escapes, as commonly used on modern ICs) on the package to increase aggregate data rate. This can increase system cost and complexity and also potentially reduce system reliability due to the large number of physical interconnects, any of which could have a manufacturing defect.

To avoid the large number of I/O pins of the parallel bus architecture, a serial bus architecture employing SERializer/DESerializers (SERDES) circuits may be implemented. FIG. 2B depicts a serial architecture that employs a single high data rate I/O interconnect 250. This approach reduces the number of I/O pins by increasing the data rate by the serialization factor. As an example, if a serialization factor of eight is used, a 2 Gb/s byte-wide data stream could be transmitted at a data rate of 16 Gb/s across one MCM channel, instead of the eight channels required for a parallel bus approach. This reduces the number of I/O pins on the package by up to a factor of eight, but increases the challenge of maintaining power efficiency since the higher data rate typically requires more complex I/O circuitry with the possible need for line equalization and more precise/higher power clock-and-data recovery (CDR) circuits.

In practice, moving to SERDES-based approaches typically also requires the use of differential line signaling to improve signal integrity at higher data rates. Differential line signaling encodes data to be transmitted as the difference in voltage between a P (positive polarity) and N (negative polarity) line. This reduces the escape pin advantage of a SERDES-based architecture by a factor of two compared to using a single-ended (SE) parallel bus architecture which nominally only requires one escape pin per I/O, but this difference can normally be compensated for by increasing the data rate of the SERDES-based design. FIG. 3A depicts a single-ended serial interconnect 304 and FIG. 3B depicts a differential serial interconnect 308.

A metric which can be used to compare different interconnect approaches is the aggregate data rate per millimeter (mm) of available die edge. As an example, a system may require 500 Gb/s to 1 terabit/second (Tb/s) throughput per mm of die edge to achieve a system performance goal of a 50 Tb/s aggregate data transfer rate. Such a high aggregate data rate may not be achievable using a parallel bus architecture since, at 2-3 Gb/s per channel, this would require on the order of hundreds of I/Os per mm which may not be achievable using even the most advanced packaging technology available today. However, by increasing line rates to the order of 50 Gb/s, only on the order of 10 I/Os per mm are needed, which is practically achievable using modern IC fabrication and packaging technology. Therefore, a desire for 50+Gb/s chip I/Os with low power and chip area for MCM applications is established to support high performance applications requiring on the order of 500 Gb/s to 1 Tb/s data escape throughput/mm. Refer to Kandou, e.g.

FIG. 4 is a schematic diagram of an inter-chip data transmission system 400, in accordance with an example embodiment. In one example embodiment, a constant Hamming weight (also referred to as constant-DC herein) serial encoder 404 is implemented at the transmitter. The function of the constant Hamming weight encoder 404 is to input N data bits with arbitrary Hamming weight and output M bits, M>N, with a constant Hamming weight. Example codes include, but are not limited to, an 8/11 code which accepts eight data bits and outputs an 11-bit codeword and a 16/20 code which accepts 16 data bits at input and outputs a 20-bit codeword. Compared to conventional differential line signaling, which achieves constant-DC by effectively adding the complement of an input data bit to the transmitted bus, this coding method achieves the same net effect in terms of achieving a constant-DC transmission as differential encoding with much less escape pin overhead (as an example, for a 16-bit differentially encoded bus, 32 output lines are needed vs. only 20 using the embodiment of FIG. 4). This improves the pin efficiency of the design, enabling higher aggregate throughput per mm of die edge to support high performance applications.

After constant-weight encode by the constant-weight encoder 452, the codeword bits are serialized by serializer 444 and transmitted across a data bus 416 in parallel by transmit buffers 448-1 . . . 448-M (referred to as transmit buffers 448 herein) with as low time skew as possible between individual data lanes to maintain constant DC across the data bus 416 as a function of time. In one example embodiment, low time skew is accomplished through the use of short interconnect lines combined with electrical length matching in the physical layout. In one example embodiment, the maximum time skew between any two lines in the bus is less than 1/4 of a bit duration on the line and the data bus 416 comprises a short (typically less than 2 inches or 5 centimeters) run on an MCM package substrate. At the receiver, a constant Hamming weight serial decoder 408 decodes the constant-weight encode operation performed at the transmitter. A reference generator 412 inputs the voltage signals from the data bus 416 to produce a voltage reference signal VREF which is used by receiver level comparators 420-1 . . . 420-M (referred to as receiver level comparators 420 herein) to provide a comparator reference threshold to decide if a one or zero was transmitted. The decoder function 424, incorporating a deserializer 428 and a constant-weight decoder 432, inputs the decoded binary information output from the M-level binary comparators and outputs the N information bits originally encoded at the transmitter.

In one example embodiment, a forwarded-clock system, as shown in FIG. 1, is used where a transmitter clock derived by a transmitter phase-locked loop (PLL) 436 is forwarded using differential signaling 440 to the deserializer 428 to create sample clocks for the receiver level comparators 420. The forwarded clock enables a minimization of the receiver complexity and removes correlated clock jitter between the transmit buffers 448 and latches of the deserializer 428. In one example method, a clock may be recovered from the received data instead of using the differential signaling 440.

In one example embodiment, the encode/decode functions are implemented in CMOS technology using methods known in the art, and described in Sulaiman A. Al-Bassam, PHD Dissertation, "Balanced Codes," Oregon State University, 1990 (hereinafter Al-Bassam), which details realization techniques applicable for both an 8/11 constant-DC code based on serial decoding and a 16-20 DC balanced code based on parallel decoding. While other codes are possible, the above codes are attractive for data transmission systems since the width of the input data is a multiple of a conventional byte (8-bit) data unit. In one example embodiment, a 16-20 code is used since it minimizes the lane overhead needed to achieve constant-DC bus transmission while also achieving exact DC balance (i.e., every bus codeword has ten ones and ten zeroes). FIG. 5 is a listing of the first few codewords for example 8/11 and 16/20 codes created from the balanced codes/serial decoding and balanced codes/parallel decoding algorithms described in Al-Bassam, respectively, in accordance with an example embodiment. The inter-chip data transmission system 400 is applicable to any method that performs a unique one-to-one mapping of N information bits to M output parallel bus bits with controlled (ideally constant) Hamming weight. As an example of a controlled Hamming weight which is not constant DC, the well-known 8/10 encoding method could also be considered for use. This code produces codewords with output weights of 4, 5, or 6 using an output bus width of length 10. However, use of a non-constant DC code such as the 8/10 code may not be preferred in some practical embodiments due to introduction of data-dependent ground bounce and extra data-dependent noise added to the receiver self-reference circuitry. Conceptually, an arbitrary mapping of input data to output bus codewords could be done using a lookup table at the transmitter and receiver, but this would be somewhat complex to realize efficiently, so the hardware efficient constant-DC codes such as those presented in Al-Bassam are appropriate in one or more embodiments. The codes may also be modified arbitrarily to improve characteristics such as per-lane disparity balance as long as the constant-DC characteristic of the codeword is preserved by the modification. As an example of a code modification, consider the four codeword bits appended to the 16 data lines in the 16-20 code. Any two of these 4-bit codewords with equivalent weight may be swapped, while preserving the constant-DC bus. As a specific example, a 4-bit codeword value of 0011 and a 4-bit codeword value of 1100 can be swapped (at the transmitter, if 0011 is computed, then 1100 is transmitted and vice-versa, while at the receiver, if 0011 is received, it is translated to 1100 and vice versa). This same swap may be done with codewords 0111 and 1011. This type of code modification can provide improved per-lane disparity (a balance of ones and zeroes on each individual line of the bus), thereby distributing current draw across the bus more uniformly.

In some applications, it may be desirable to arrange the physical transmission of the data bits across the data bus 416 in a permuted order to maximize the uniformity of 1 and 0 bits in the spatial dimension. Such spatial permutation of the transmitted bit order can improve the balance of the current draw across the data bus 416, i.e. instead of having most of the current draw in one physical area for any given bus codeword, it is more uniformly distributed across the space that the data bus 416 escape is realized in. For example, consider a 16/20 codeword permutation from a 20-bit codeword b to a permuted 20-bit codeword bp described by:

bp[0]=b[0], bp[1]=b[8], bp[2]=b[16], bp[3]=b[5],
bp[4]=b[13], bp[5]=b[2], bp[6]=b[10], bp[7]=b[18],
bp[8]=b[7], bp[9]=b[15], bp[10]=b[4], bp[11]=b[12],
bp[12]=b[1], bp[13]=b[9], bp[14]=b[17], bp[15]=b[6],
bp[16]=b[14], bp[17]=b[3], bp[18]=b[11], bp[19]=b[19]

where index 0 describes the least-significant bit in the codeword. FIG. 6 is a listing of the resulting permuted codeword, in accordance with an example embodiment. If this codeword was mapped linearly to space in the hardware realization, it exhibits improved uniformity of return current draw across space using the permuted codeword. In one example embodiment, the physical lanes may be realized in a two-dimensional escape pattern, so other arbitrary codeword permutations may be desired to improve the uniformity of return current draw across the spatial escape geometry used. Given the description herein, the skilled artisan will be able to apply suitable DC balance schemes both known in the art or others created for a specific purpose (such as minimization of hardware realization complexity) to implement the parallel bus transmission.

In one example embodiment, the codeword bits may be serialized to a high data rate, potentially in the range of 16 Gb/s to 50 Gb/s or higher using methods that will be apparent to the skilled artisan, given the teachings herein. In one example embodiment, a typical serializer function comprises a low rate clock, such as a C32 clock operating at 1/32 the rate of the full-rate output, used to input 32-bit wide data. A higher rate clock, such as a C8 clock, can be used to transmit each of the four 8-bit values in the 32-bit wide data in time series by multiplexing the 32-bit data to an 8-bit data bus at uniformly spaced times across the C32 time period. This serialization process continues until the final output rate of the line is achieved, i.e. the original parallel data at the C32 clock rate is transmitted in series at the C1 clock rate on the line. In the case that the codeword bits are serialized prior to transmission on the M-bit data bus 416, the serializer 444 should be designed in a way such that the M serializers output the M bits from the constant-weight encode at the same time.

Figure 7:
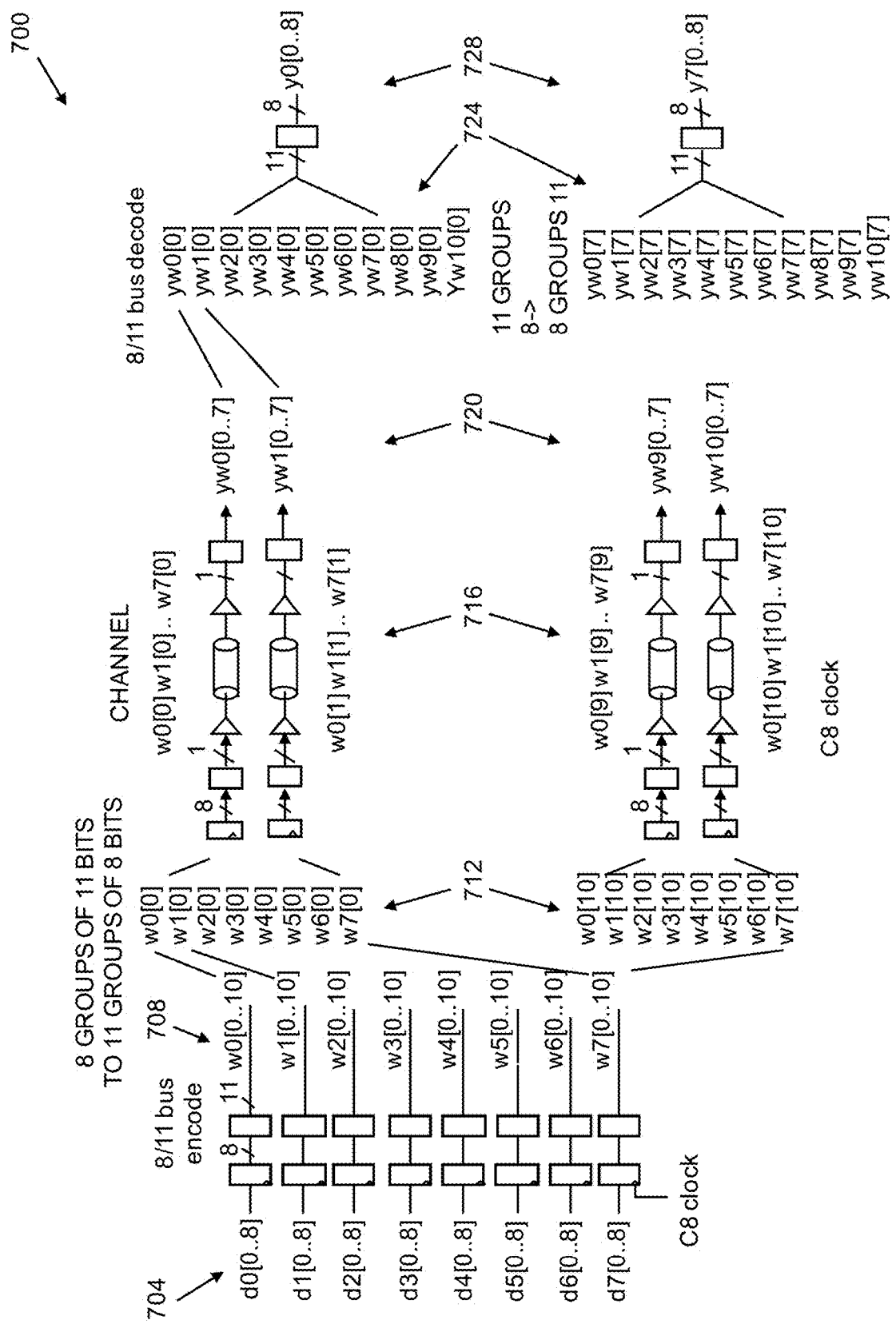
FIG. 7 is a high-level diagram of a system using an x8 serializer/deserializer together with an 8/11 constant-weight bus encode, in accordance with an example embodiment.

FIG. 7 is a high-level diagram of a system 700 using an x8 serializer/deserializer together with an 8/11 constant-weight bus encode, in accordance with an example embodiment. A similar realization can be configured using the 16/20 constant-weight code, or any other arbitrary constant weight code. In the example system shown in FIG. 7, eight byte-wide parallel data streams 704 operating at a C8 clock (1/8 speed of the line rate) are encoded to 11-bit wide constant-DC parallel outputs 708. These eight 11-bit wide parallel data words are then partitioned into 11 8-bit wide parallel data words 712 as shown in FIG. 7. Each of these 11 8-bit wide parallel data words 712 are then serialized up to the line rate (the C1 clock rate) and transmitted across an 11-bit wide physical single-ended bus 716 to a destination receiver. The destination receiver performs the inverse operation of the transmitter. It first de-serializes the C1 rate data to 11 8-bit wide data streams 720 clocked at a C8 rate, then partitions the 11 8-bit wide streams 720 to 8 11-bit wide streams 724 clocked at the C8 rate. These 11-bit wide streams 724 are then decoded to 8-bit wide data streams 728 to recover the original parallel data streams. Other serializer architectures using other input parallel data rates and intermediate serialization factors may be used as long as the serializer architecture produces a final parallel transmission of controlled-weight (ideally constant-DC) codewords across a final parallel bus clocked at the C1 clock rate.

Figure 8:
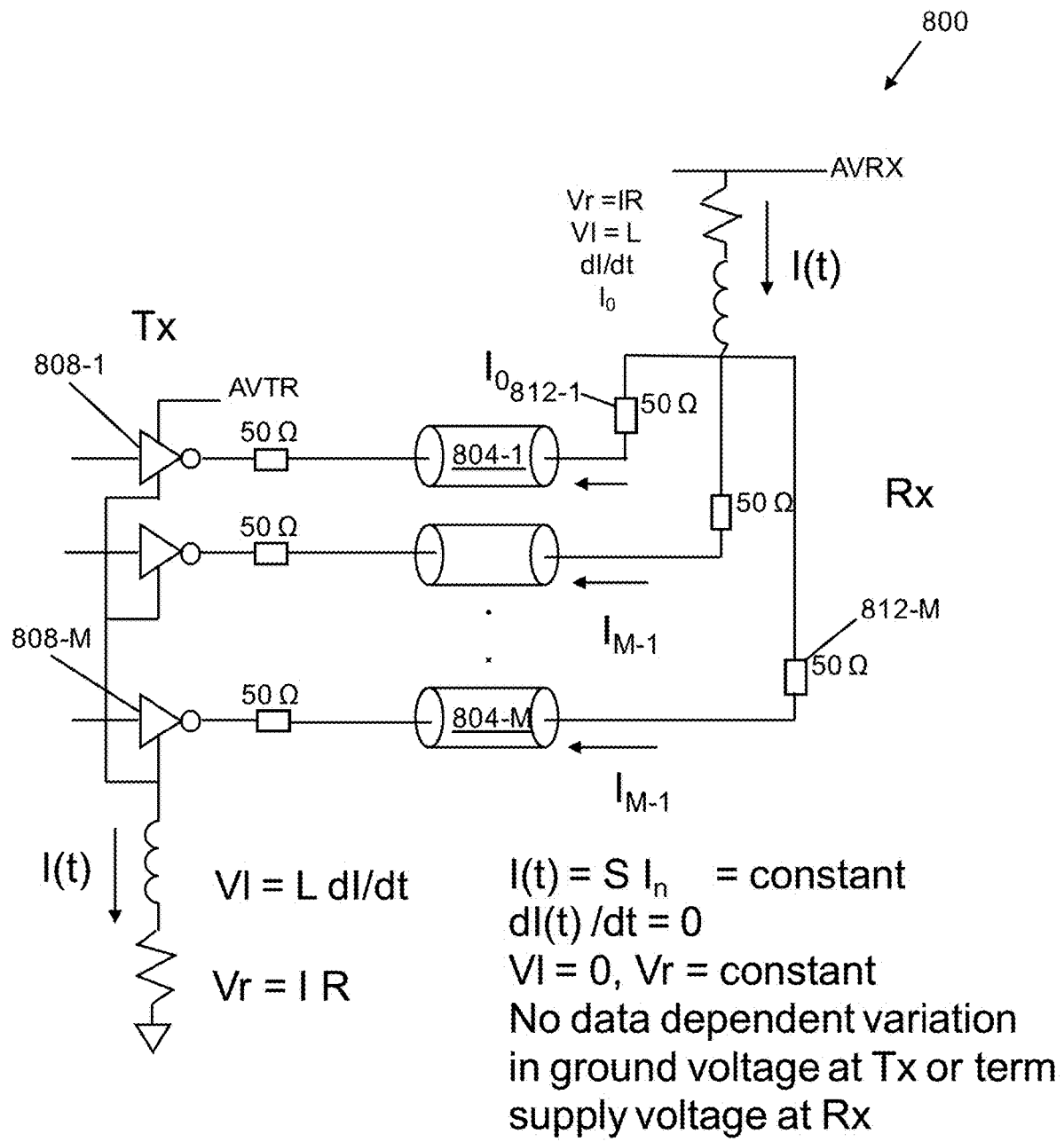
FIG. 8 illustrates a bus transmission system comprising M parallel single-ended lines driven by source-series terminated (SST) drivers at a transmitter, in accordance with an example embodiment.

FIG. 8 illustrates a bus transmission system 800 comprising M parallel single-ended lines 804-1 . . . 804-M driven by source-series terminated (SST) drivers 808-1 . . . 808-M at a transmitter, in accordance with an example embodiment. The signals propagate through a nominal 50 ohm characteristic impedance channel, with 50 ohm termination 812-1 . . . 812-M to a positive termination voltage at the receiver. When a low level is being transmitted on any given line, the current flow in that line is given by AVRX/100 ohms. When a high level is being transmitted, the current flow is (AVRX−AVTX)/100, which is nominally zero if AVRX and AVTX are the same. In a non-bus-encoded system, the number of zeroes and ones on the line at any given time can be arbitrary, so the aggregate current flow through the ground impedance at the transmitter (illustrated as a series RL) and through the power supply impedance at the receiver can vary anywhere from nominally 0 to M*AVRX/100. This varying current induces varying voltages across the transmitter ground impedance (V=L dI/dT for inductor, V=IR for resistor), creating the well-known "ground bounce" degradation. A similar noise is created on the receiver supply through its supply R+L.

The number of data lines in the 0 state and 1 state across the bus is ensured to never change as a function of the data by the operation of the constant-weight bus encode process, thereby directly addressing the data-dependent ground-bounce problem. Thus, if any given line switches from 1 to 0, a corresponding line somewhere else on the bus switches from 0 to 1, making the current draw through ground and supply impedances constant, and effectively removing the data-dependent ground-bounce effect.

Figure 9:
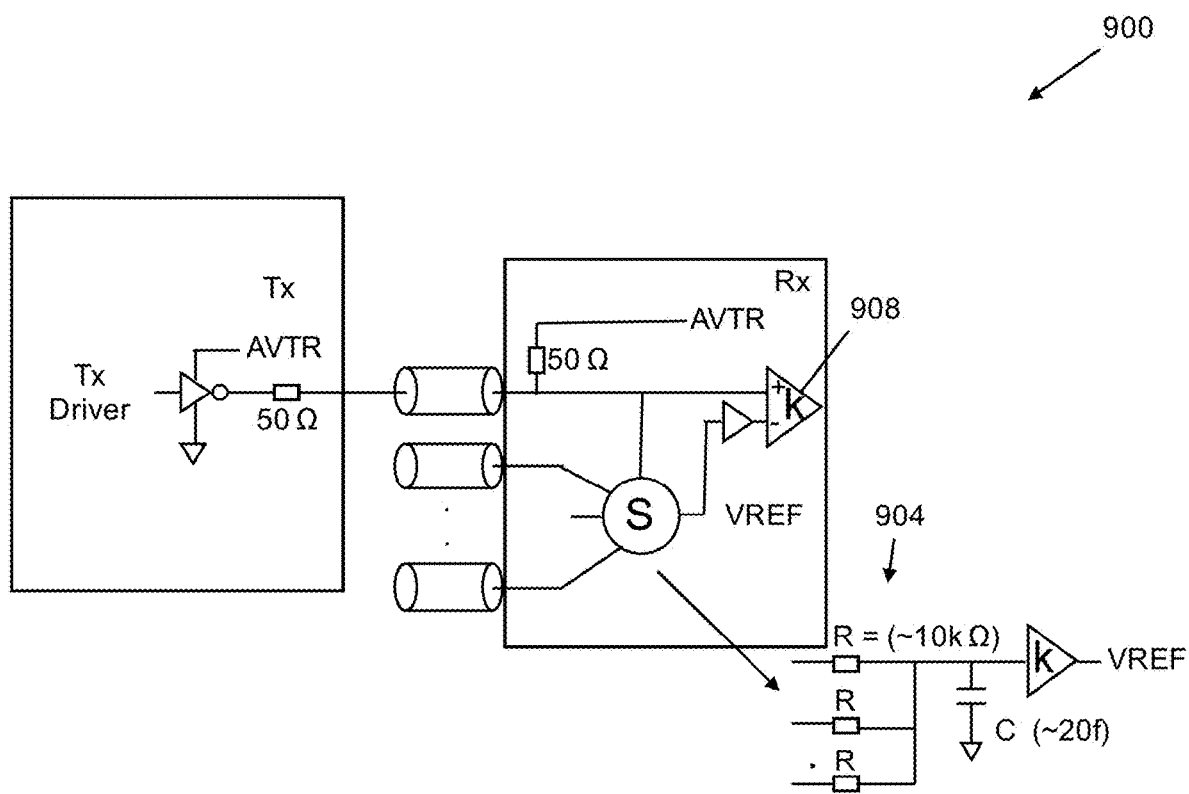
FIG. 9 illustrates the self-referencing feature of the inter-chip data transmission system, in accordance with an example embodiment.

A challenging problem in single-ended data transmission systems is generation of an appropriate reference voltage to compare a received signal against at the receiver in order to determine if a 1 or 0 data bit was transmitted. The constant-weight bus encode solves this problem by enabling the data bus to be self-referenced. FIG. 9 illustrates the self-referencing feature 900 of the inter-chip data transmission system, in accordance with an example embodiment. Since there are a constant number of ones and zeroes on the line, the voltages across the bus at the receiver will always have a fixed number of "V0" levels and "V1" levels, where "V0" is the voltage for a 0 bit and "V1" is the voltage for a 1 bit. A simple resistive summing circuit 904 can then be used to form the reference voltage (halfway between V0 and V1 for a DC balanced encode such as 16/20). In an example embodiment, the resistive summing circuit 904 will also be low-pass filtered to remove noise from the VREF signal. In the case of a constant-DC but non-DC balanced code such as 8/11, a scale factor k needs to be applied to the summed VREF signal to place it at the optimal threshold. As an example, if the 8/11 code produces five 0s and six 1s on the line, the resistively summed self-reference voltage is multiplied by 5/6 to be used as a comparator reference in the receiver. This fixed scaling is easily achieved using an op-amp gain buffer circuit 908.

In one example embodiment, a single bit-error across the bus can be detected if the expected Hamming weight at the receiver decoder input is not correct. In an example embodiment, each received bit across the bus is XOR'ed together using an M-input XOR gate. For a DC balanced bus, such as the example 16-20 code, the XOR function will output a zero if the received number of bits is even and will output a one if the received number of bits is odd. Therefore, if a single (or odd number) of bit-errors is made on the line, the XOR function will output a one, indicating an invalid codeword. A similar XOR gate structure may be employed with the example 8/11 code. In this case, the expected number of one bits into the XOR will be either five or six depending on the code design, so the XOR function will detect an odd number of bit-errors if the XOR gate outputs a zero (for a weight-5 constant DC encode) or outputs a one (for a weight-6 constant-DC code).

In one aspect, an exemplary single-ended inter-chip data transmission system 400 comprises a controlled Hamming weight parallel data encoder 404 at a transmitter device configured to accept N data bits with an arbitrary Hamming weight as input and generate M data bits with a controlled Hamming weight as output, wherein M is greater than N; and a transmission circuit 448 for a time-aligned transmission of the controlled Hamming weight encoded data across a single-ended data bus 416.

In one aspect, a single-ended inter-chip data reception system 400 comprises a self-reference generator 412, the self-reference generator 412 configured to produce a voltage reference signal based on two or more analog signals of a received data bus 416; and a constant Hamming weight data decoder 432 configured to accept M data bits with a constant Hamming weight as input and generate N data bits with an arbitrary Hamming weight as output, wherein M is greater than N.

In one aspect, a method for processing data comprises generating M data bits with a controlled Hamming weight based on N input data bits with an arbitrary Hamming weight, wherein M is greater than N; and generating a time-aligned transmission of the controlled Hamming weight encoded data across a single-ended data bus 416.

In one example embodiment, the controlled Hamming weight parallel data encoder 404 produces a constant Hamming weight encoded output. In one example embodiment, a transmitter clock circuit is configured to derive a transmission clock using a transmitter phase-locked loop (PLL) 436 and to transmit the transmission clock using differential signaling 440. In one example embodiment, N=8 and M=11 or N=16 and M=20. In one example embodiment, the N data bits are arranged in a permuted order to maximize a uniformity of a count of one bits and a count of zero bits in a spatial dimension. In one example embodiment, the self-reference generator 412 further comprising a resistive summing circuit 904 to generate the voltage reference signal halfway between a voltage for a logic zero and a voltage for a logic one for a DC balanced encode. In one example embodiment, the voltage reference signal is scaled for a constant-DC and non-DC balanced code.

In one example embodiment, the single-ended inter-chip data reception system 408 further comprises a low-pass filter to remove noise from the voltage reference signal. In one example embodiment, the single-ended inter-chip data reception system 408 further comprises two or more receiver level comparators 420, each receiver level comparator 420 configured to convert one of the analog signals to a digital signal based on the voltage reference signal.

In one example embodiment, the single-ended inter-chip data reception system 408 further comprises a receiver clock circuit configured for receiving a transmission clock using differential signaling 440 and controlling deserializing of the M bits. In one example embodiment, the controlled Hamming weight encoded data has a constant Hamming weight. In one example embodiment, a transmission clock is derived using a transmitter phase-locked loop (PLL) 436 and transmitting the transmission clock using differential signaling 440. In one example embodiment, the transmission clock is received using differential signaling 440 and controlling deserializing of the M bits. In one example embodiment, a voltage reference signal is produced based on two or more analog signals of a received data bus; and N data bits are generated with an arbitrary Hamming weight as output based on the M data bits with a constant Hamming weight as input, wherein M is greater than N.

In one example embodiment, data is encoded to achieve constant DC transmission across a single-ended electrical parallel bus, where the total current on the parallel bus is at a constant level thereby reducing ground and supply bounce when data is switching. The transmission bandwidth density is improved, using single-ended bus transmission at tens of Gb/s and using encoders to reduce ground and supply bounce.

Figure 11:
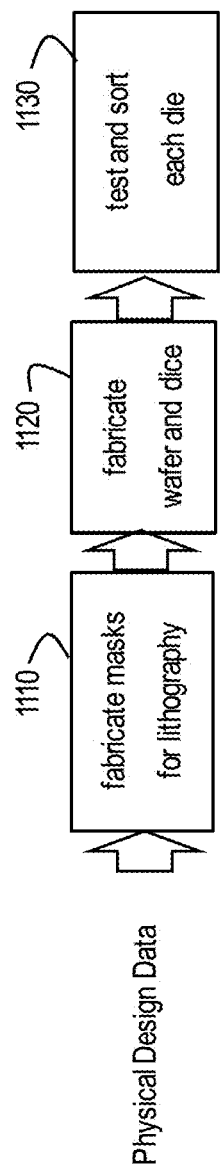
FIG. 11 is a flow diagram of a design process used in semiconductor design, manufacture, and/or test.

In one or more embodiments, a further step includes fabricating a physical integrated circuit in accordance with the analytical placement. One non-limiting specific example of accomplishing this is described elsewhere herein in connection with FIGS. 11-13. For example, a design structure, based on the analytical placement, is provided to fabrication equipment to facilitate fabrication of a physical integrated circuit in accordance with the design structure. In one or more embodiments, the layout is instantiated as a design structure.

In one or more embodiments, a physical integrated circuit is fabricated in accordance with the design structure.

Figure 12:
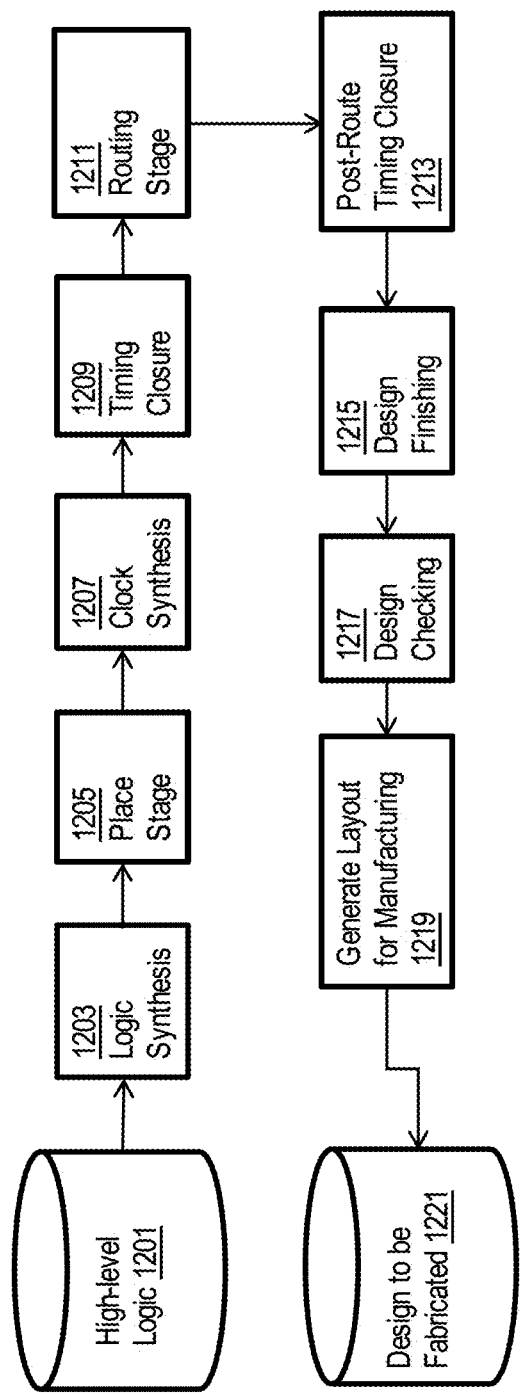
FIG. 12 shows further aspects of IC fabrication from physical design data.

As noted, in one or more embodiments, the layout is instantiated as a design structure. See discussion of FIG. 11. A physical integrated circuit is then fabricated in accordance with the design structure. See again discussion of FIG. 11. Refer also to FIG. 12. Once the physical design data is obtained, based, in part, on the placement processes described herein, an integrated circuit designed in accordance therewith can be fabricated according to known processes that are generally described with reference to FIG. 12. Generally, a wafer with multiple copies of the final design is fabricated and cut (i.e., diced) such that each die is one copy of the integrated circuit. At block 1110, the processes include fabricating masks for lithography based on the finalized physical layout. At block 1120, fabricating the wafer includes using the masks to perform photolithography and etching. Once the wafer is diced, testing and sorting each die is performed at 1130 to filter out any faulty die.

One or more embodiments include a computer including a memory 28; and at least one processor 16, coupled to the memory, and operative to carry out or otherwise facilitate any one, some, or all of the method steps described herein.

Figure 10:
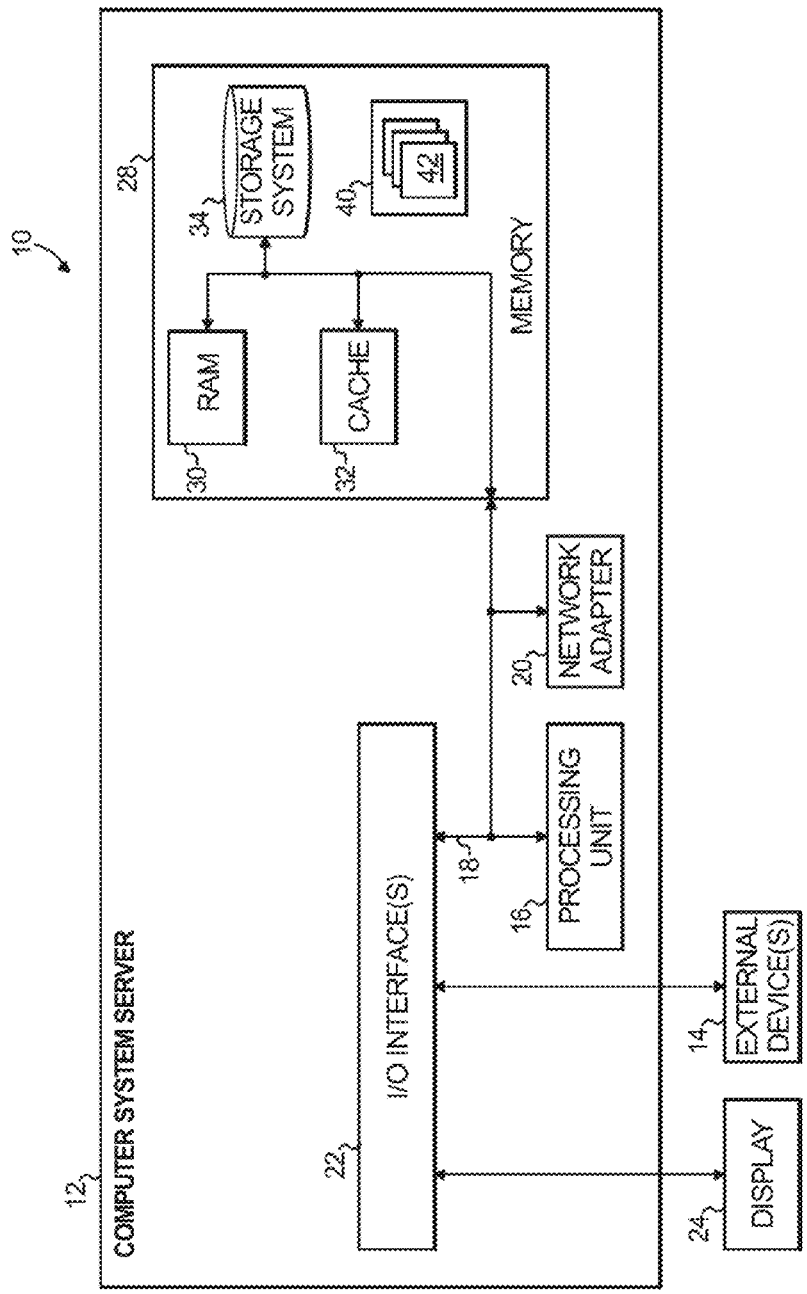
FIG. 10 depicts a computer system that may be useful in implementing one or more aspects and/or elements of the invention.

Furthermore, referring to FIG. 10, in one or more embodiments the at least one processor is operative to generate a design structure for the integrated circuit design in accordance with the placement analysis, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure.

Exemplary System

One or more embodiments of the invention, or elements thereof, can be implemented using an apparatus including a memory and at least one processor that is coupled to the memory and operative to perform exemplary method steps.

FIG. 12 depicts an example high-level Electronic Design Automation (EDA) tool flow, which is responsible for creating an optimized microprocessor (or other IC) design to be manufactured. A designer could start with a high-level logic description 1201 of the circuit (e.g. VHDL or Verilog). The logic synthesis tool 1203 compiles the logic, and optimizes it without any sense of its physical representation, and with estimated timing information. The placement tool 1205 takes the logical description and places each component, looking to minimize congestion in each area of the design. The clock synthesis tool 1207 optimizes the clock tree network by cloning/balancing/buffering the latches or registers. The timing closure step 1209 performs a number of optimizations on the design, including buffering, wire tuning, and circuit repowering; its goal is to produce a design which is routable, without timing violations, and without excess power consumption. The routing stage 1211 takes the placed/optimized design, and determines how to create wires to connect all of the components, without causing manufacturing violations. Post-route timing closure 1213 performs another set of optimizations to resolve any violations that are remaining after the routing. Design finishing 1215 then adds extra metal shapes to the netlist, to conform with manufacturing requirements. The checking steps 1217 analyze whether the design is violating any requirements such as manufacturing, timing, power, electromigration or noise. When the design is clean, the final step 1219 is to generate a layout for the design, representing all the shapes to be fabricated in the design to be fabricated 1221.

One or more embodiments of the invention, or elements thereof, can be implemented in the form of an apparatus including a memory and at least one processor that is coupled to the memory and operative to perform exemplary method steps. FIG. 10 depicts a computer system that may be useful in implementing one or more aspects and/or elements of the invention; it is referred to herein as a cloud computing node but is also representative of a server, general purpose-computer, etc. which may be provided in a cloud or locally.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 10, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 10, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 10) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the elements depicted in the block diagrams and/or described herein. The method steps can then be carried out using the distinct software modules/routines and/or sub-modules/subroutines of the system, as described above, executing on one or more processing units 16. Further, a computer program product as described below can include code adapted to be implemented to carry out one or more method steps described herein, including the provision of the system with the distinct software modules.

In any case, it should be understood that the components illustrated herein may be implemented in various forms of hardware, software, or combinations thereof; for example, application specific integrated circuit(s) (ASICS), functional circuitry, one or more appropriately programmed general purpose digital computers with associated memory, and the like. Given the teachings of the invention provided herein, one of ordinary skill in the related art will be able to contemplate other implementations of the components of the invention.

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

Figure 13:
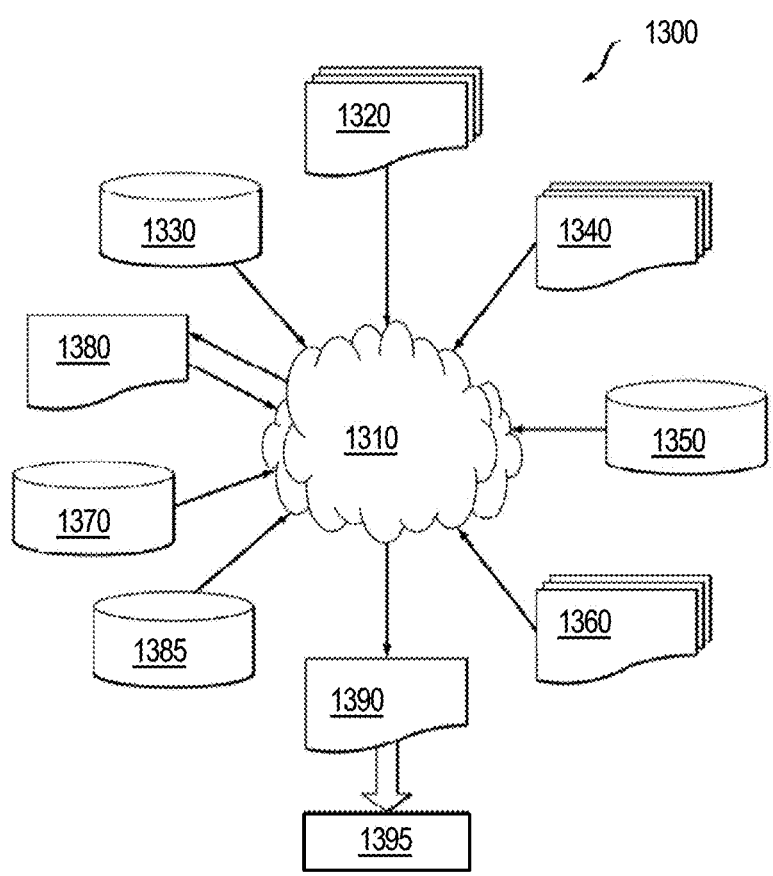
FIG. 13 shows an exemplary high-level Electronic Design Automation (EDA) tool flow, within which aspects of the invention can be employed.

One or more embodiments integrate the timing analysis techniques herein with semiconductor integrated circuit design simulation, test, layout, and/or manufacture. In this regard, FIG. 13 shows a block diagram of an exemplary design flow 1300 used for example, in semiconductor IC logic design, simulation, test, layout, and manufacture. Design flow 1300 includes processes, machines and/or mechanisms for processing design structures or devices to generate logically or otherwise functionally equivalent representations of design structures and/or devices, such as those that can be analyzed using timing analysis or the like. The design structures processed and/or generated by design flow 1300 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1300 may vary depending on the type of representation being designed. For example, a design flow 1300 for building an application specific IC (ASIC) may differ from a design flow 1300 for designing a standard component or from a design flow 1300 for instantiating the design into a programmable array, for example a programmable gate array (PGA) or a field programmable gate array (FPGA) offered by Altera® Inc. or Xilinx® Inc.

FIG. 13 illustrates multiple such design structures including an input design structure 1320 that is preferably processed by a design process 1310. Design structure 1320 may be a logical simulation design structure generated and processed by design process 1310 to produce a logically equivalent functional representation of a hardware device. Design structure 1320 may also or alternatively comprise data and/or program instructions that when processed by design process 1310, generate a functional representation of the physical structure of a hardware device. Whether representing functional and/or structural design features, design structure 1320 may be generated using electronic computer-aided design (ECAD) such as implemented by a core developer/designer. When encoded on a gate array or storage medium or the like, design structure 1320 may be accessed and processed by one or more hardware and/or software modules within design process 1310 to simulate or otherwise functionally represent an electronic component, circuit, electronic or logic module, apparatus, device, or system. As such, design structure 1320 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1310 preferably employs and incorporates hardware and/or software modules for synthesizing, translating, or otherwise processing a design/simulation functional equivalent of components, circuits, devices, or logic structures to generate a Netlist 1380 which may contain design structures such as design structure 1320. Netlist 1380 may comprise, for example, compiled or otherwise processed data structures representing a list of wires, discrete components, logic gates, control circuits, I/O devices, models, etc. that describes the connections to other elements and circuits in an integrated circuit design. Netlist 1380 may be synthesized using an iterative process in which netlist 1380 is resynthesized one or more times depending on design specifications and parameters for the device. As with other design structure types described herein, netlist 1380 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 1310 may include hardware and software modules for processing a variety of input data structure types including Netlist 1380. Such data structure types may reside, for example, within library elements 1330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1340, characterization data 1350, verification data 1360, design rules 1370, and test data files 1385 which may include input test patterns, output test results, and other testing information. Design process 1310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1310 without deviating from the scope and spirit of the invention. Design process 1310 may also include modules for performing standard circuit design processes such as timing analysis, verification, design rule checking, place and route operations, etc. Improved placement can be performed as described herein.

Design process 1310 employs and incorporates logic and physical design tools such as HDL compilers and simulation model build tools to process design structure 1020 together with some or all of the depicted supporting data structures along with any additional mechanical design or data (if applicable), to generate a second design structure 1390. Design structure 1390 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1320, design structure 1390 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 1090 may comprise a compiled, executable HDL simulation model that functionally simulates the devices to be analyzed.

Design structure 1390 may also employ a data format used for the exchange of layout data of integrated circuits and/or symbolic data format (e.g. information stored in a GDSII (GDS2), GL1, OASIS, map files, or any other suitable format for storing such design data structures). Design structure 1390 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 1390 may then proceed to a stage 1395 where, for example, design structure 1390: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A single-ended inter-chip data transmission system comprising:
   a controlled Hamming weight parallel data encoder at a transmitter device configured to accept N data bits with an arbitrary Hamming weight as input and generate M data bits with a controlled Hamming weight as output, wherein M is greater than N; and
   a transmission circuit for a time-aligned transmission of the controlled Hamming weight encoded data across a single-ended data bus.

2. The single-ended inter-chip data transmission system of claim 1, where the controlled Hamming weight parallel data encoder produces a constant Hamming weight encoded output.

3. The single-ended inter-chip data transmission system of claim 1, further comprising a transmitter clock circuit configured to derive a transmission clock using a transmitter phase-locked loop (PLL) and to transmit the transmission clock using differential signaling.

4. The single-ended inter-chip data transmission system of claim 2, where N=8 and M=11 or N=16 and M=20.

5. The single-ended inter-chip data transmission system of claim 1, the N data bits are arranged in a permuted order to maximize a uniformity of a count of one bits and a count of zero bits in a spatial dimension.

6. A single-ended inter-chip data reception system comprising:
- a self-reference generator, the self-reference generator configured to produce a voltage reference signal based on two or more analog signals of a received data bus; and
- a constant Hamming weight data decoder configured to accept M data bits with a constant Hamming weight as input and generate N data bits with an arbitrary Hamming weight as output, wherein M is greater than N.

7. The single-ended inter-chip data reception system of claim 6, the self-reference generator further comprising a resistive summing circuit to generate the voltage reference signal halfway between a voltage for a logic zero and a voltage for a logic one for a DC balanced encode.

8. The single-ended inter-chip data reception system of claim 7, wherein the voltage reference signal is scaled for a constant-DC and non-DC balanced code.

9. The single-ended inter-chip data reception system of claim 6, further comprising a low-pass filter to remove noise from the voltage reference signal.

10. The single-ended inter-chip data reception system of claim 6, further comprising two or more receiver level comparators, each receiver level comparator configured to convert one of the analog signals to a digital signal based on the voltage reference signal.

11. The single-ended inter-chip data reception system of claim 6, further comprising a receiver clock circuit configured for receiving a transmission clock using differential signaling and controlling deserializing of the M bits.

12. The single-ended inter-chip data reception system of claim 6, where N=8 and M=11 or N=16 and M=20.

13. A method for processing data, the method comprising:
- generating M data bits with a controlled Hamming weight based on N input data bits with an arbitrary Hamming weight, wherein M is greater than N; and
- generating a time-aligned transmission of the controlled Hamming weight encoded data across a single-ended data bus.

14. The method of claim 13, wherein the controlled Hamming weight encoded data has a constant Hamming weight.

15. The method of claim 13, further comprising deriving a transmission clock using a transmitter phase-locked loop (PLL) and transmitting the transmission clock using differential signaling.

16. The method of claim 15, further comprising receiving the transmission clock using differential signaling and controlling deserializing of the M bits.

17. The method of claim 13, where N=8 and M=11 or N=16 and M=20.

18. The method of claim 13, wherein the N data bits are arranged in a permuted order to maximize a uniformity of a count of one bits and a count of zero bits in a spatial dimension.

19. The method of claim 13, further comprising:
- producing a voltage reference signal based on two or more analog signals of a received data bus; and
- generating N data bits with an arbitrary Hamming weight as output based on the M data bits with a constant Hamming weight as input, wherein M is greater than N.

20. The method of claim 13, further comprising generating a voltage reference signal halfway between a voltage for a logic zero and a voltage for a logic one for a DC balanced encode.

* * * * *